United States Patent
Yu et al.

(10) Patent No.: US 7,906,418 A0
(45) Date of Patent: Mar. 15, 2011

(54) SEMICONDUCTOR DEVICE HAVING SUBSTANTIALLY PLANAR CONTACTS AND BODY

(75) Inventors: Chung-Yi Yu, Hsin-Chu (TW); Chi-Hsin Lo, Jhabel (TW); Chia Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1397 days.

(21) Appl. No.: 10/727,272

(22) Filed: Dec. 3, 2003

(65) Prior Publication Data
US 2005/0127432 A1    Jun. 16, 2005

(51) Int. Cl.
*H01L 21/3205* (2006.01)

(52) U.S. Cl. .................. 438/585; 257/E21.23

(58) Field of Classification Search ............... 438/585, 438/689, 690, 691, 692; 257/E21.04, E21.214, 257/E21.23, E21.237, E21.304, E21.483
See application file for complete search history.

(56) References Cited

U.S. PATENT DOCUMENTS

| | | | |
|---|---|---|---|
| 5,575,706 A * | 11/1996 | Tsai et al. ................. 438/693 |
| 6,136,710 A * | 10/2000 | Quek et al. ............... 438/691 |
| 6,174,767 B1 | 1/2001 | Chi |
| 6,225,646 B1 | 5/2001 | Gardner et al. |
| 6,435,942 B1 | 8/2002 | Jin et al. |
| 6,436,764 B1 | 8/2002 | Hsieh |
| 6,436,769 B1 | 8/2002 | Kanamori |
| 6,440,796 B2 | 8/2002 | Sung |
| 6,441,429 B1 | 8/2002 | Hsieh et al. |
| 6,451,654 B1 | 9/2002 | Lin et al. |
| 6,451,698 B1 | 9/2002 | Au et al. |
| 6,451,699 B1 | 9/2002 | Gregory |
| 6,464,855 B1 | 10/2002 | Chadda et al. |
| 6,465,836 B2 | 10/2002 | Lin et al. |
| 6,465,841 B1 | 10/2002 | Hsieh et al. |
| 6,468,863 B2 | 10/2002 | Hsieh et al. |
| 6,479,348 B1 | 11/2002 | Kamal |
| 6,482,700 B2 | 11/2002 | Chen et al. |
| 6,486,032 B1 | 11/2002 | Lin et al. |
| 6,489,649 B2 | 12/2002 | Kobayashi et al. |
| 6,492,231 B2 | 12/2002 | Liu et al. |
| 6,504,206 B2 | 1/2003 | Sung et al. |
| 6,524,167 B1 | 2/2003 | Tsai et al. |
| 6,524,915 B2 * | 2/2003 | Kim et al. .............. 438/267 |
| 6,528,844 B1 | 3/2003 | Hopper et al. |
| 6,531,732 B2 | 3/2003 | Sugita et al. |
| 6,531,734 B1 | 3/2003 | Wu |
| 6,534,821 B2 | 3/2003 | Hsieh et al. |
| 6,855,602 B2 * | 2/2005 | Chang et al. ........... 438/264 |
| 7,022,608 B2 * | 4/2006 | Sun et al. .............. 438/691 |
| 2002/0119629 A1 | 8/2002 | Kim et al. |
| 2002/0142543 A1 | 10/2002 | Lin et al. |
| 2002/0142545 A1 | 10/2002 | Lin |
| 2003/0022442 A1 * | 1/2003 | Cho et al. ............. 438/257 |
| 2003/0052361 A1 | 3/2003 | Liu et al. |
| 2003/0113969 A1 * | 6/2003 | Cho et al. ............. 438/257 |
| 2003/0139010 A1 * | 7/2003 | Wang .................... 438/257 |
| 2004/0156247 A1 * | 8/2004 | Cho et al. ............. 365/200 |
| 2004/0171243 A1 * | 9/2004 | Lee et al. .............. 438/593 |

* cited by examiner

*Primary Examiner* — Scott B. Geyer
(74) *Attorney, Agent, or Firm* — Haynes and Boone, LLP

(57) ABSTRACT

A method of manufacturing a semiconductor device, wherein a gate structure is formed over a substrate, an interconnect layer is formed over the gate structure and the substrate, and a cap layer is formed over the interconnect layer. The interconnect layer and the cap layer are then planarized to form a substantially planar surface. A mask layer, such as an oxide mask layer, is formed over the planarized portions of the interconnect layer, and the planarized cap layer and portions of the interconnect layer are removed by etching around the mask layer.

21 Claims, 2 Drawing Sheets

SEMICONDUCTOR DEVICE HAVING SUBSTANTIALLY PLANAR CONTACTS AND BODY

BACKGROUND

The present disclosure relates generally to the field of integrated circuit fabrication and, more particularly, to planarizing topographic features formed on a substrate for integrated circuit technologies.

The demand for storage devices that have a small package size and a high storage density have increased due to the creation of many new applications that require high density storage devices. Accordingly, semiconductor device geometries continue to dramatically decrease in size, to the extent that existing devices routinely have feature geometries smaller than 90 nm. However, such scaling has been plagued by interconnect defects and the increasing complexity of controlling dimensions.

One semiconductor device frequently employed for portable storage is based upon flash memory technology. A generally adopted elemental structure for a flash memory device is the split gate field effect transistor (SGFET) device, which includes a channel region and opposing source/drain regions formed in a semiconductor substrate. A split gate FET also includes a split gate structure typically including a floating gate and a control gate.

The manufacture of such SGFET devices for use in a flash memory device or other semiconductor device requires critical control of device dimensions and material defects which could attribute to device failure. To that end, plasma and/or chemical etch back has proven to provide reasonably accurate control of device dimensions, particularly layer thickness and feature height.

For example, a typical SGFET may incorporate a word line or other interconnect adjacent to the SGFET structure. Such an arrangement may provide more efficient utilization of substrate area, thereby increasing flash device packing density. Plasma and/or chemical etch back is one planarizing process generally employed in the manufacture of the SGFET and adjacent word lines or interconnects to control their shape and geometry. However, existing manufacturing processes, particularly etch back processes, often provide features having poorly-defined profiles. For example, the corners of the surfaces resulting from planarizing by plasma and/or chemical etch back may be rounded. Moreover, planarizing adjacent features of different heights (or "topographic features") may result in a build-up of excess material in gaps between features of similar height. Such a build-up may result in a jagged edge along a vertical surface of taller topographic features, such that this result is often referred to as a "fence" edge due to the resemblance of the profile to a picket fence. These poorly defined profiles may provide inadequate isolation between features, such as between bit lines, word lines and other interconnects. Consequently, the poorly defined profile and undesired build-up of residue resulting from existing etch back processes can cause electrical shorts between interconnects, thereby limiting device performance and yield, and possibly resulting in catastrophic failure of a device during testing or at the end-user.

Therefore, a method of planarizing topographic features is needed to address the problems discussed above.

SUMMARY

The present disclosure relates to a method of manufacturing a semiconductor device, and a semiconductor device created employing the method. In one embodiment, the method includes forming a gate structure over a substrate, forming an interconnect layer over the gate structure and the substrate, and forming a cap layer over the interconnect layer. The interconnect layer and the cap layer are then planarized to form a substantially planar surface. A mask layer is formed over the planarized portions of the interconnect layer, and the planarized cap layer and portions of the interconnect layer are removed by etching around the mask layer.

In another embodiment, the method includes providing a substrate having a plurality of layers formed thereon, the layers forming a plurality of topographic features of varying heights relative to a reference plane that is parallel to a principal plane of the substrate. The substrate is coupled to a rotatable polishing head, and the topographic features are contacted with a rotatable polishing platen with a pressure of at least 5.0 psi. The contact is maintained while rotating at least one of the polishing head and the polishing platen, thereby removing portions of the topographic features to form a substantially planar surface.

In another embodiment, a semiconductor device is provided. The semiconductor device includes a source region formed in a substrate, a gate oxide layer formed over the substrate and having an opening over the source region, and a gate layer formed over the gate oxide and having an opening exposing the source region and defining split gates opposing the source region. A source interconnect is formed over the source region, and spacers are formed over and beside the split gates to isolate the split gates from the source interconnect. Isolation layers are formed on the substrate and on outside walls of the spacers, and line interconnects are formed laterally adjacent the spacers and over the isolation layers. The spacers, isolation layers and line interconnects collectively form a substantially planar surface.

DETAILED DESCRIPTION

Figure 1:
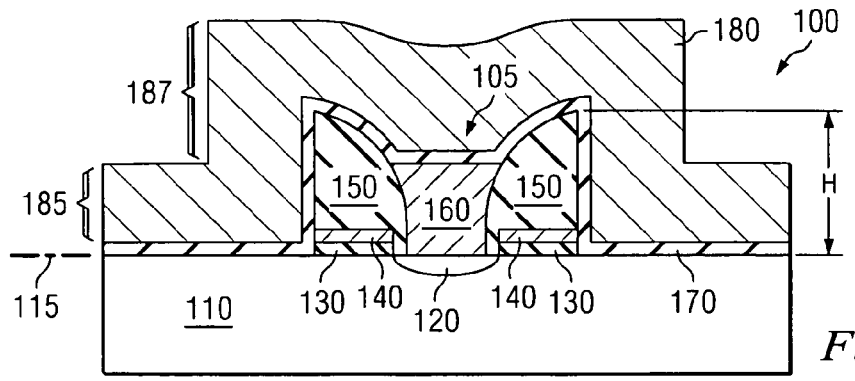
FIGS. 1-5 illustrate sectional views of one embodiment of a device during intermediate stages of manufacture according to aspects of the present disclosure.

The present disclosure relates generally to the field of integrated circuit fabrication and, more particularly, to planarizing topographic features formed on a semiconductor or other substrate for integrated circuit technologies. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring initially to FIG. 1, illustrated is a sectional view of one example of a split gate field effect transistor (SGFET) device 100 in an intermediate stage of manufacture according to aspects of the present disclosure. Only a portion of the SGFET device 100 is illustrated in FIG. 1 so that an exemplary planarizing method according to aspects of the present disclosure may be more clearly described.

As shown in FIG. 1, the SGFET device 100 may be a single-junction semiconductor device. The device 100 may also be one of a plurality or array of SGFET cells included in a semiconductor device. However, for the purpose of clarity and brevity, FIG. 1 only illustrates a single device 100. In addition, although aspects of the present disclosure are described in reference to a SGFET device, those skilled in the art will recognize that the present disclosure may be readily adapted to other semiconductor devices.

The device 100 includes a substrate 110 having a source region 120 formed therein. The substrate 110 may be a single crystal or other silicon substrate, a silicon-on-insulator (SOI) substrate comprising a silicon or germanium epitaxial layer on a silicon or sapphire substrate, a plastic or other flexible substrate, or other conventional or future-developed substrates. The substrate 110 may be or include a contact to a semiconductor device or interconnect. For example, the substrate 110 may be or include a semiconductor wafer or other layers formed on a semiconductor substrate. The source region 120 may be formed by implanting phosphorus, boron or other dopants by diffusion, ion implantation or other processes. In one embodiment, the source region 120 may be formed in a heavier doped region or active region in the substrate 110. The substrate 110 may include other features not shown in FIG. 1, such as isolation regions on opposing sides of the source region 120, including those formed by local oxidation of silicon (LOCOS) and shallow trench isolation (STI). Accordingly, the particular composition of the substrate 110 and the source region 120 and other features formed in the substrate 110 are not limited by the scope of the present disclosure.

The device 100 also includes gate oxide layers 130 formed on the substrate 110, split gates 140 formed on the gate oxide layers 130, spacers 150 formed on the split gates 140, and a source interconnect 160 formed between the spacers 150 and over the source region 120. The gate oxide layers 130, split gates 140 and spacers 150 may be collectively referred to as a gate structure 105. The gate structure 105 may be formed by depositing an oxide layer and a gate material layer on the substrate 110, etching an opening therein to expose a portion of the substrate and define the gate oxide layers 130 and the split gates 140, forming a spacer material layer on the oxide layer and the exposed substrate portion, and etching the spacer material layer to form the spacers 150. In one embodiment, the formation of the source region 120 may employ the split gates 140 as a mask prior to depositing the spacer material layer. After the spacers 150 are formed, the source interconnect 160 may be formed over the source region 120 and between the spacers 150, possibly to a thickness that is less than a height H of the gate structure 105, as shown in FIG. 1. In one embodiment, the spacers 150 may isolate the split gates 140 from the source interconnect 160, such that the split gates 140 may be biased by capacitive coupling upon the biasing of the source interconnect 160. The patterning steps described above may include photo-lithography, maskless photo-lithography, contact lithography, plasma or dry etching, ion milling, wet etching, chemical etching or other processes.

The gate oxide layers 130 may comprise $SiO_2$, $Ta_2O_5$, $Hf_2O$, $ZrO_2$ or other dielectric materials to provide a desired equivalent oxide thickness, and may be formed by atomic layer deposition (ALD), chemical vapor deposition (CVD), plasma enhanced CVD (PECVD), physical vapor deposition (PVD), thermal or rapid-thermal-processing (RTP) oxidation, or in-situ steam generation (ISSG) RTP oxidation. The gate oxide layers 130 may have a thickness of about 100 Angstroms or less.

The split gates 140 may comprise metal silicide, doped or undoped polysilicon, metal oxide, a barrier layer and metal conductor, a barrier layer and a non-metal conductor or other materials that provide adequate electrical device performance based upon application-specific requirements. The split gates 140 may be formed by ALD, CVD, PECVD, PVD or other processes. The split gates 140 may have a width ranging between about 10 nm and about 400 nm and may have a thickness ranging between about 1 Angstrom and about 800 Angstroms.

The spacers 150 may comprise $SiO_2$ or other dielectric materials, and may be selected to comply with the thermal budget of the device fabrication process. The spacers 150 may be formed by ALD, CVD, PECVD, thermal or RTP oxidation, ISSG RTP oxidation, PVD or other processes. The spacers 150 may have a thickness ranging between about 10 nm and about 400 nm and a width ranging between about 1 nm and about 400 nm.

The source interconnect 160 may comprise one or more conductive materials, including polysilicon, metal silicide or metal oxide, and may also include a barrier layer or cladding such as Ti, Ta, TiN, TaN, TiW, CN, SiC, and SiCO. The source interconnect 160 may be formed by ALD, CVD, PECVD, PVD or an electroplating copper process (ECP), and may have a thickness ranging between about 10 nm and about 400 nm and a width ranging between about 1 nm and about 400 nm. Moreover, as shown in FIG. 1, the source interconnect 160 may have a tapered cross-section profile or a vertical profile, depending on the geometries of neighboring features.

The SGFET device 100 may also include an isolation layer 170 employed to isolate the previously discussed features from subsequently formed interconnects. The isolation layer 170 may comprise $SiO_2$, $Si_3N_4$ or other dielectric materials, possibly selected to comply with the thermal budget of the fabrication process. The isolation layer 170 may be formed by ALD, CVD, PECVD, a spin-on process, thermal or RTP oxidation, ISSG RTP oxidation or PVD, and may have a thickness ranging between about 1 Angstrom and about 300 Angstroms.

The SGFET device 100 also includes an interconnect layer 180 that may be employed as a bit line, word line or other interconnect (collectively referred to herein as line interconnects). In the embodiment shown in FIG. 1, the interconnect layer 180 is formed by blanket deposition over the isolation layer 170, although selective deposition may also be employed. The interconnect layer 180 may comprise one or more of many conductive materials, such as a doped or un-doped polysilicon, metal silicide and metal oxide, and may include a barrier layer comprising Ti, Ta, TiN, TaN, TiW, CN, SiC, and/or SiCO. The interconnect layer 180 may be formed by ALD, CVD, PECVD, ECP or PVD, and may have a thickness ranging between about 5 nm and about 400 nm and a width ranging between about 5 nm and about 400 nm. In one embodiment, the thickness of the interconnect layer 180 may be less than the height H of the gate structure 105.

The features described above may be referred to as topographic features for the purpose of the present disclosure. That is, as shown in FIG. 1, many of the features may have varying heights relative to a reference plane 115 that is parallel to a principal plane of the substrate 110. For example, the gate structure 105 extends to a height H above the reference plane 115, whereas the source interconnect 160 has a thickness that is less than the height H of the gate structure 105. Similarly, the interconnect layer 180 includes a first portion 185 having a thickness that is less than the height H and a second portion 187 having a thickness that is greater than the height H. As described above, conventional methods of planarizing such topographic features can provide inadequate results, including rounded corners, excessive residue build-up and jagged edges.

Figure 2:
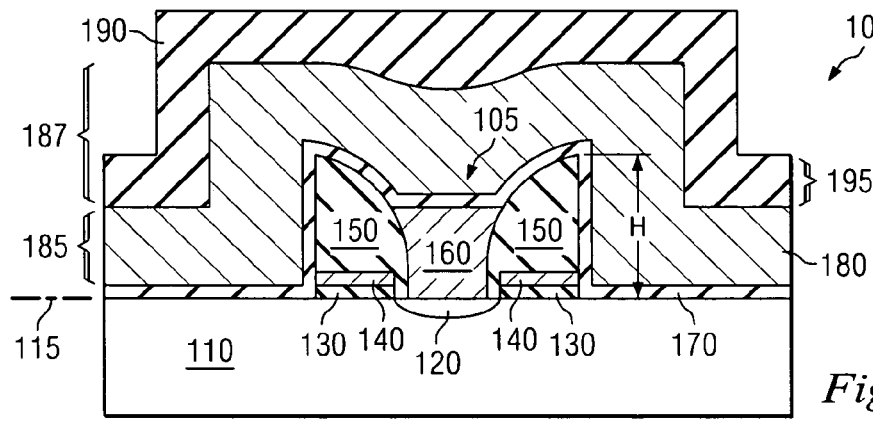

Referring to FIG. 2, illustrated is a sectional view of one embodiment of the device 100 shown in FIG. 1 after a cap layer 190 is formed over the interconnect layer 180. The cap layer 190 may comprise $SiO_2$, $Si_3N_4$ or other dielectric materials that may be compatible with the thermal budget and mechanical stress induced by subsequent chemical mechanical polish (CMP) processing. The cap layer 190 may be blanket or selectively deposited by ALD, CVD, PECVD, a spin-on process, thermal or RTP oxidation, ISSG RTP oxidation or PVD, and may have a thickness ranging between about 100 Angstroms and about 2000 Angstroms. In one embodiment, a portion 195 of the cap layer 190 may extend below the height H of the gate structure 105, such as when the thickness of the interconnect layer 180 is less than the height H of the gate structure 105, whereby the portion 195 may be employed as a mask during subsequent processing.

Figure 3:
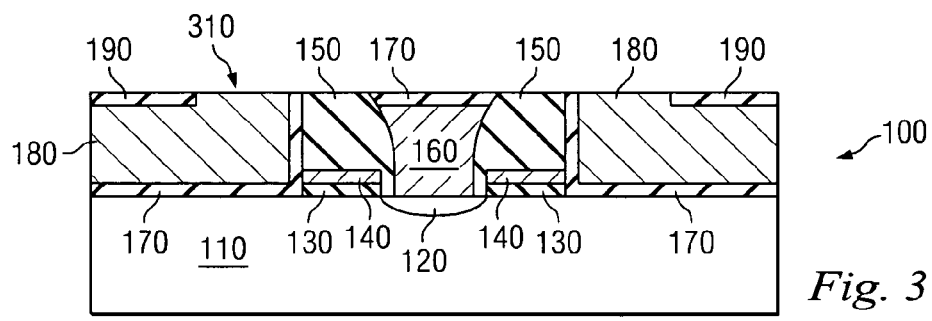

Referring to FIG. 3, illustrated is a sectional view of the SGFET device 100 shown in FIG. 2 after undergoing a planarizing process. The planarizing process may form a substantially planar surface 310 across the spacers 150, source interconnect 160, isolation layers 170, interconnect layer 180 and/or cap layer 190, or the remaining portions thereof, collectively. In one embodiment, the CMP parameters may be selected such that a portion of the cap layer 190 having a thickness of at least about 200 Angstroms remains after polishing. Allowing for at least 200 Angstroms of the cap layer 190 may provide adequate protection against oxidation in subsequent processing steps.

The planarizing demonstrated in FIG. 3 may include chemical-mechanical polishing (CMP) performed under conventional CMP parameters. However, in one embodiment, wherein the parameters of the CMP process may vary from those conventionally employed, which may reduce or eliminate the inadequate results of conventional planarizing methods. For example, a higher downward force may be applied to the substrate 110 during CMP, such as by a substrate holder or polishing head, thereby increasing a polishing rate ratio. In one example, the downward force applied during CMP may be about 5.0 psi. The downward force may also range between about 5.0 psi and about 10.0 psi. In contrast, conventional CMP processes typically employ a downward force that is less than about 4.2 psi.

The polishing rate ratio may be a comparison of the polishing rate of substrate areas having features of higher profiles to the polishing rate of substrate areas having features of lower profiles. Accordingly, increasing this polishing rate ratio, such as by increasing the downward force employed during polishing, may remove material from taller features at a faster rate than the removal rate of material from shorter features. In other words, high topographic areas may be polished faster than low topographic areas when a higher polishing rate ratio is achieved. By removing the material from the high topographic areas on the substrate 110 faster than from the low topographic areas, the rounded corners and jagged edges between higher topographic features that result during conventional planarizing methods may be reduced or eliminated. As such, corners may be more defined and interfaces between neighboring topographic features may be cleaner and substantially free of residue build-up and jagged edges.

Increasing the downward force may not be the only manner in which a higher polishing rate ratio may be provided. For example, increasing the rotation speed employed during CMP may also increase the polishing rate ratio. Thus, in one embodiment, the polishing head to which the substrate 110 is coupled may be rotated at a speed ranging between about 75 rpm and about 200 rpm. In a more specific embodiment, the polishing head speed may range between about 90 rpm and about 100 rpm. In contrast, conventional CMP processes typically employ a polishing head speed that is less than about 63 rpm.

Similarly, the platen employed during CMP to polish the topographic features formed on the substrate 110 may be rotated at a speed ranging between about 65 rpm and about 150 rpm. In a more specific embodiment, the platen speed may range between about 85 rpm and about 95 rpm. In contrast, conventional CMP processes typically employ a platen speed that is less than about 57 rpm.

The selectivity of the features undergoing CMP may also be adjusted to achieve a desired polishing rate ratio. That is, the materials employed to form the topographic features may be selected based on their resistance to CMP. Thus, higher topographic features may comprise materials selected based on their lower resistance to CMP, whereas lower topographic features may comprise materials selected based on their higher resistance to CMP. In other words, the selectivity of the materials employed to form the higher topographic features may be greater than the selectivity of the materials employed to form the lower topographic features. In one embodiment, the selectivity of the higher topographic features may be about three times to about five times the selectivity of the lower topographic features, such that the polishing rate ratio may be about 3:1. For example, in the embodiment shown in FIGS. 1 and 2, the cap layer 190 may comprise $Si_3N_4$ and the interconnect layer 180 may comprise polysilicon. Because polysilicon is about three times as resistant to CMP as $Si_3N_4$, a polishing rate ratio of about 3:1 or about 5:1 may be achieved.

An increased polishing rate ratio may also be achieved by selection of the chemical composition of a slurry used during CMP. That is, the slurry may be more selective to the higher topographic features than to the lower topographic features. In one embodiment, the selectivity of the slurry to the higher topographic features may be three times as great as the selectivity of the slurry to the lower topographic features.

Moreover, conventional fabrication processes employing plasma and/or chemical etch back do not incorporate the cap layer 190 with CMP, thereby increasing the likelihood of residue build-up and possibly leaving jagged edges. However, by incorporating the cap layer 190 according to aspects of the present disclosure, such as one having one-third the resistivity to planarizing as underlying layers (e.g., the interconnect layer 180), the occurrence of residue build-up may be reduced or eliminated and the formation of non-uniform edges at interfaces between higher topographic features may be prevented.

Figure 4:
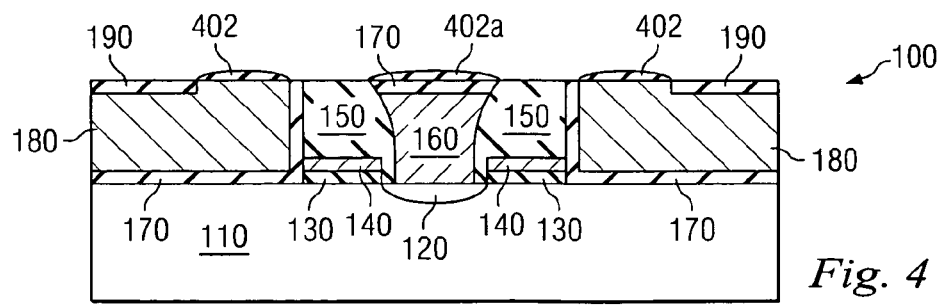

Referring to FIG. 4, illustrated is a section view of the device 100 shown in FIG. 3 in a subsequent stage of manufacture. A mask layer 402 is formed over portions of the source interconnect 160 and interconnect layer 180 exposed by the previous planarizing process, including in some embodiments, a relatively thin portion over the spacers 150 and the interconnect 160, designated as mask layer 402a. In one embodiment, the cap layer 190 includes $SiO_2$, and the mask layer 402 includes $Si_3N_4$. In another embodiment, the cap layer 190 includes Si3N$_4$ and the mask layer 402 includes SiO$_2$. The mask layer 402 may be blanket or selectively formed by ALD, CVD, PECVD, spin-on method, ISSG oxidation and PVD. The mask layer 402 may also be formed by an anneal process, such as thermal or RTP oxidation. The process conditions for depositing the mask layer 402 may include a process temperature ranging between about 550° C. and about 950° C. in a process environment that may include N$_2$, O$_2$ and/or 1,2-Dichloroethylene (DCE). The mask layer 402 may have a thickness ranging between about 1 Angstrom and about 2000 Angstroms, although the thickness may vary depending upon the design rule specification of the SGFET device 100. The mask layer 402 may provide protection for the areas where poly-silicon may reside during subsequent etch processes.

Figure 5:
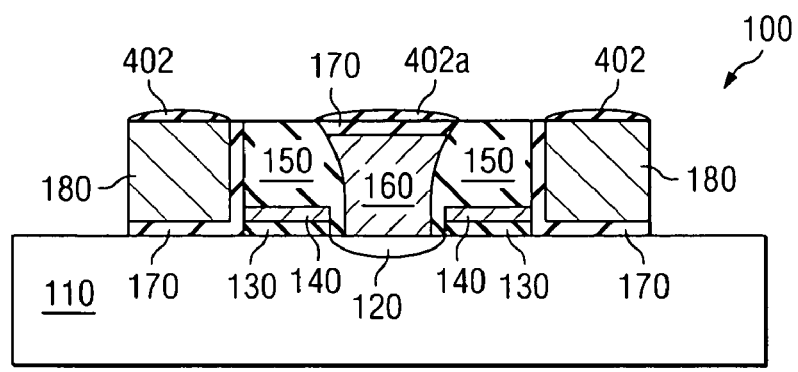

Referring to FIG. 5, illustrated is a section view of the device 100 shown in FIG. 4 after the removal of the remaining portions of the cap layer 190 and portions of the isolation layer 170 and the interconnect layer 180. The mask layer 402 may be employed for such removal, and may then be removed itself, as shown in FIG. 5. The removal of the cap layer 190, isolation layer 170, interconnect layer 180 and/or mask layer 402 may be accomplished by a selective plasma and/or chemical etch. The mask layer 402 prevents etching of the underlying materials. Also, the SiO$_2$ spacers 150 also prevent etching of the underlying materials. However, the material underlying the cap layer 190 is removed.

The use of the mask layer 402 in combination with the CMP process according to aspects of the present disclosure provides the desired box shape for the SGFET structure. The implementation of the mask layer 402 allows for resulting source and drain contacts to have substantially clean and planar surfaces after the removal of portions of the isolation layer 170 and the interconnect layer 180. A clean and planar surface for the source and drain contacts permits good contact of subsequently formed metal silicide, refractory barrier metal, and/or contact fill metallization according to well known methods of semiconductor manufacturing technology. In contrast, rough and/or jagged surfaces at the contacts of the SGFET often cause high contact resistance, pinholes in subsequently formed features and promotion of metal diffusion, possibly resulting in catastrophic electrical failure of the SGFET.

Figure 6:
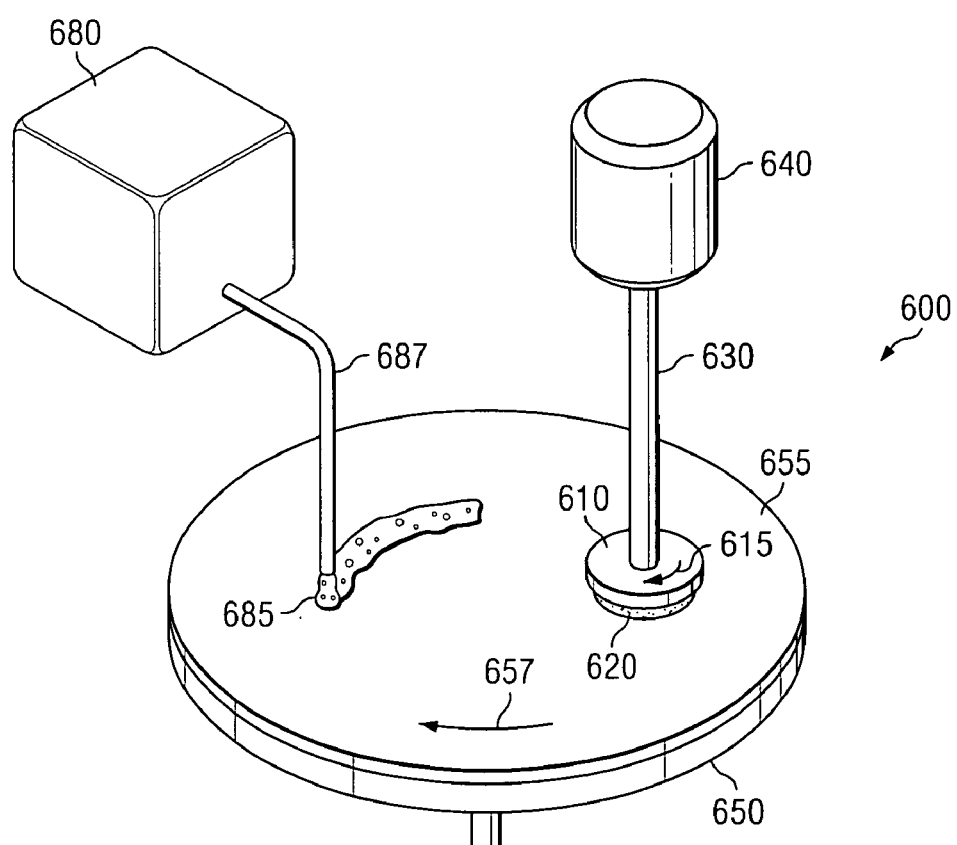
FIG. 6 illustrates a perspective view of one embodiment of a system for planarizing topographic features formed on a substrate according to aspects of the present disclosure.

Referring to FIG. 6, illustrated is a perspective view of a planarizing system 600 constructed according to aspects of the present disclosure. The system 600 is one environment in which the planarizing methods described above may be employed in the manufacture of the SGFET device of FIG. 2. Those skilled in the art will recognize that only certain features of the system 600 are described herein, and that the system 600 may include many other features not described herein or shown in FIG. 6.

The system 600 includes a polishing head 610 to which a substrate 620 (such as the substrate 100 shown in FIG. 2 may be detachably coupled. The polishing head 610 may be coupled by a shaft 630 to first driving means 640, which may be configured to rotate the polishing head 310 as indicated by the arrow 315. The first driving means 340 may rotate the polishing head 310 at speeds ranging between about 75 rpm and about 200 rpm, although speeds greater than about 200 rpm may also be possible. The first driving means 640 may also be configured to apply a force to the polishing head 610 to contact topographic features formed on the substrate 620 to a polishing platen 650. The force applied by the first driving means 640 may range between about 2.0 psi and about 10.0 psi, although higher forces may also be possible.

The platen 650 may include a polishing pad 655 of conventional or future-developed composition and geometry. The platen 650 may be coupled by a shaft 660 to second driving means 670, which may be configured to rotate the platen 650 as indicated by the arrow 657. The second driving means 670 may rotate the platen 650 at speeds ranging between about 65 rpm and about 150 rpm, although speeds greater than about 150 rpm may also be possible. The second driving means 670 may also be configured to apply a force to the platen 650 to contact the platen 650 (or polishing pad 655) to topographic features formed on the substrate 620. The force applied by the second driving means 670 may range between about 2.0 psi and about 10.0 psi. Moreover, the first and second driving means 640, 670 may cooperate to collectively apply a polishing force to the topographic features formed on the substrate 620 that ranges between about 5.0 psi and about 10.0 psi, although higher forces are also possible. Control of the first and second driving means 640, 670 to apply the polishing force to the topographic features formed on the substrate 620 and/or to rotate the polishing head 610 and/or platen 650 may be handled by means not shown in FIG. 6, such as a dedicated computer device.

The polishing system 600 may also include a slurry delivery system 680 which may deliver slurry 685 to the platen 650 (or polishing pad 655) through a conduit 687. The composition of the slurry 685 may be selected based on the desired selectivity of the slurry to the various topographic features formed on the substrate 620, as discussed above with reference to FIG. 5.

By employing one or a combination of a higher polishing force and faster polishing speeds compared to those typically employed in conventional planarizing methods, the system 600 may reduce or eliminate the rounded corners, residue build-up and jagged edges resulting from conventional planarizing. For example, as described above, one or a combination of a polishing force of about 5.0 psi applied by the first and/or second driving means 640, 670, a polishing head 610 speed of about 93 rpm and a platen 650 speed of about 87 rpm may provide a higher polishing rate ratio during CMP, such that higher topographic features formed on the substrate 620 may be polished at a faster rate than lower topographic features. Application-specific selection of the composition of the slurry 685 may also achieve or contribute to a sufficiently high polishing rate ratio.

The present invention has been described relative to preferred embodiments. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of manufacturing a semiconductor device, comprising:
    forming a gate structure over a substrate;
    forming an interconnect layer over the gate structure and the substrate;
    forming a cap layer over the interconnect layer;
    planarizing the interconnect layer and the cap layer to form a substantially planar surface, the substantially planar surface having a portion of exposed interconnect layer and a portion of exposed cap layer; and forming a mask layer over the exposed portion of the planarized interconnect layer; and removing material underlying the exposed portion of the planarized cap layer;

wherein the planarizing includes chemical-mechanical polishing (CMP); and wherein the CMP includes planarizing the cap layer and the interconnect layer between a rotatable polishing head and a rotatable polishing platen at a polishing head speed ranging between 75 rpm and 200 rpm.

2. The method of claim 1, wherein the interconnect layer is formed over the gate structure to a thickness that is less than a height of the gate structure.

3. The method of claim 1, wherein the mask layer is formed by an anneal process.

4. The method of claim 1, further comprising removing the mask layer after removing the planarized cap layer.

5. The method of claim 1, wherein a first removal rate of the interconnect layer during the planarizing is greater than a second removal rate of the cap layer during the planarizing.

6. The method of claim 5 wherein the first removal rate is at least three times greater than the second removal rate.

7. The method of claim 1, wherein the cap layer is formed directly on the interconnect layer.

8. The method of claim 1, wherein a portion of the cap layer is separated from the substrate by a distance that is less than the height of the gate structure.

9. The method of claim 1, wherein the cap layer comprises $SiO_2$.

10. The method of claim 1, wherein the cap layer comprises $Si_3N_4$.

11. The method of claim 10 wherein the mask layer comprises $SiO_2$.

12. The method of claim 1, wherein the removing material includes removing the cap layer and removing polysilicon.

13. The method of claim 1, wherein the cap layer has a thickness ranging between 100 angstroms and 2000 angstroms before planarizing.

14. The method of claim 1, wherein the CMP includes rotating the polishing platen at a platen speed ranging between 65 rpm and 10 rpm.

15. The method of claim 1, wherein the device is a split gate field effect transistor.

16. The method of claim 1, wherein the planarizing is done at a planarizing pressure of at least 5.0 psi.

17. A method of manufacturing a semiconductor device, comprising:
    forming a gate structure over a substrate;
    forming an interconnect layer over the gate structure and the substrate;
    forming a cap layer over the interconnect layer;
    planarizing the interconnect layer and the cap layer to form a substantially planar surface, the substantially planar surface having a portion of exposed interconnect layer and a portion of exposed cap layer; and
    forming a mask layer over the exposed portion of the planarized interconnect layer; and removing material underlying the exposed portion of the planarized cap layer;
    wherein the planarizing includes chemical-mechanical polishing (CMP); and
    wherein the CMP includes planarizing the cap layer and the interconnect layer between a rotatable polishing head and a rotatable polishing platen at a planarizing pressure of at least 5.0 psi.

18. The method of claim 17, wherein the planarizing includes rotating the polishing head at a speed ranging between 75 rpm and 200 rpm.

19. The method of claim 18, wherein the planarizing includes rotating the polishing platen at a speed ranging between 65 rpm and 150 rpm.

20. The method of claim 19, wherein the speed of the polishing platen is 87 rpm.

21. A method of planarizing topographic features on a substrate, comprising:
    providing a substrate having a plurality of layers formed thereon, the layers forming a plurality of topographic features of varying heights relative to a reference plane that is parallel to a principal plane of the substrate;
    coupling the substrate to a rotatable polishing head;
    contacting the topographic features with a rotatable polishing platen; and
    maintaining the contacting while rotating at least one of the polishing head and the polishing platen, thereby removing portions of the topographic features to form a substantially planar surface;
    wherein the rotating includes rotating the polishing head at a speed ranging between 75 rpm and 200 rpm; and
    wherein the plurality of layers includes an interconnect layer formed over a semiconductor device gate structure and a cap layer formed over the interconnect layer, wherein portions of the interconnect layer are removed at a slower rate than portions of the cap layer are removed.

* * * * *